United States Patent
Hardtdegen et al.

(10) Patent No.: US 9,798,237 B2
(45) Date of Patent: Oct. 24, 2017

(54) METHOD FOR OPTICAL TRANSMISSION OF A STRUCTURE INTO A RECORDING MEDIUM

(71) Applicant: FORSCHUNGSZENTRUM JUELICH GMBH, Juelich (DE)

(72) Inventors: Hilde Hardtdegen, Aachen (DE); Martin Mikulicz, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 14/415,022

(22) PCT Filed: Jul. 12, 2013

(86) PCT No.: PCT/DE2013/000377
§ 371 (c)(1),
(2) Date: Jan. 15, 2015

(87) PCT Pub. No.: WO2014/026662
PCT Pub. Date: Feb. 20, 2014

(65) Prior Publication Data
US 2015/0168840 A1 Jun. 18, 2015

(30) Foreign Application Priority Data

Aug. 16, 2012 (DE) .................. 10 2012 016 178

(51) Int. Cl.
*G11B 9/10* (2006.01)
*G03F 7/20* (2006.01)

(52) U.S. Cl.
CPC .............. *G03F 7/201* (2013.01); *G03F 7/20* (2013.01); *G03F 7/70383* (2013.01); *G03F 7/70391* (2013.01)

(58) Field of Classification Search
None
See application file for complete search history.

(56) References Cited

U.S. PATENT DOCUMENTS

| | | | |
|---|---|---|---|
| 4,943,861 A * | 7/1990 | Lambert | H04N 1/40043 347/184 |
| 5,553,036 A * | 9/1996 | Takemura | G11B 5/00 365/160 |

(Continued)

FOREIGN PATENT DOCUMENTS

| | | |
|---|---|---|
| CN | 101419410 | 4/2009 |
| CN | 201993577 | 9/2011 |

(Continued)

OTHER PUBLICATIONS

Yuan Z et al: "Electrically driven single-photon source", Science, American Association for the Advancement of Science, Washington, DC; US, Jan. 4, 2002 (Jan. 4, 2002), Seiten 102-105, XP002278163, ISSN: 0036-8075, DOI: 10.1126/SCIENCE, 1066790 Zusammenfassung.

(Continued)

*Primary Examiner* — Peter Vincent Agustin
(74) *Attorney, Agent, or Firm* — Norris McLaughlin & Marcus, P.A.

(57) ABSTRACT

A method for optical transmission of a structure into a recording medium which can be transformed locally from a first undefined state into a second defined state by irradiating with photons from a photon source. The two states of the recording medium are manifested in different physical and/or chemical properties of the recording medium. At least one photon source having a photon flux of less than $10^4$ photons per second is selected for the irradiation with the photons. It was recognized that with such a low photon flux especially fine structures can advantageously be transmitted into the recording medium without the irradiation having to be partially blocked by a mask. In this manner, for a given wavelength (energy) of the photons, structures can be transmitted that are considerably smaller than the width, defined (Continued)

by the diffraction limit, of the probability distribution for the locations at which the emitted photons are incident.

11 Claims, 6 Drawing Sheets

(56) References Cited

U.S. PATENT DOCUMENTS

| | | | | | |
|---|---|---|---|---|---|
| 5,625,617 | A | * | 4/1997 | Hopkins | G11B 7/12 250/216 |
| 5,825,847 | A | * | 10/1998 | Ruth | G03F 7/70025 378/119 |
| 6,046,925 | A | * | 4/2000 | Tsien | B82Y 10/00 365/110 |
| 6,243,348 | B1 | * | 6/2001 | Goodberlet | B82Y 10/00 369/101 |
| 2004/0027964 | A1 | * | 2/2004 | Lehureau | G11B 7/005 369/94 |
| 2006/0126477 | A1 | * | 6/2006 | Livingston | B23K 26/0626 369/116 |
| 2007/0078613 | A1 | * | 4/2007 | Kurtin | G03F 7/2014 702/57 |
| 2015/0168840 | A1 | * | 6/2015 | Hardtdegen | G03F 7/20 250/492.1 |

FOREIGN PATENT DOCUMENTS

| | | |
|---|---|---|
| CN | 102369484 | 3/2012 |
| DE | 203 16 241 | 4/2004 |
| JP | 2008-186585 | 8/2008 |

OTHER PUBLICATIONS

Mangar-Poladian, G.: "Sub-wavelength resolution laser lithography in the field of Mems", Proceedings of SPIE vol. 7007, 70070L-1 bis 70070L-11 (2008).

* cited by examiner

METHOD FOR OPTICAL TRANSMISSION OF A STRUCTURE INTO A RECORDING MEDIUM

BACKGROUND OF THE INVENTION

Microstructures and nanostructures are usually created by means of optical lithography. The substrate to be structured is first overlaid with a recording medium. The structure to be created is imparted to this recording medium by locally irradiating the recording medium with light through a mask. It is thereby transformed from an unwritten into a written state which is manifested in altered physical and/or chemical properties of the recording medium. The recording medium is then selectively removed either only at the written sites or only at the unwritten sites, whereupon the substrate can be processed, for instance etched, at the exposed sites.

The minimum size of the structures to be written is defined, for diffraction reasons, by the order of magnitude of the light wavelength. Therefore, in order to reduce the size of the structures, i.e. to improve the spatial resolution, the light wavelength used must be increasingly further reduced. The time-consuming and costly need to create a new mask each time the structure is changed limits the use of optical lithography in practice, especially for the prototypical creation of new structures.

The problem addressed by the invention is therefore that of providing a method for optically imparting a structure to a recording medium, which offers an improved spatial resolution and at the same time does not require the creation of a mask.

SUMMARY OF THE INVENTION

Within the context of the invention, a method has been developed for optically imparting a structure to a recording medium which can be transformed locally from a first unwritten state to a second written state by irradiating with photons from a photon source. The two states of the recording medium are manifested in different physical and/or chemical properties of the recording medium.

According to the invention, at least one photon source having a photon flux of less than $10^4$ photons per second is selected for the irradiation with the photons.

It has been recognized that, with such a low photon flux, particularly fine structures can advantageously be imparted to the recording medium without the irradiation having to be partially shielded by a mask. Instead, for such low photon fluxes, other possibilities exist for defining the structures written into the recording medium: by way of example, an arrangement consisting of a plurality of photon sources or of a large number of photon sources may be selected. If these cannot be actuated separately (passive lithography), the written structure is defined by the positions of the photon sources; if they can be actuated separately (active lithography), the written structure is additionally defined by the actuation pattern. In addition, the photon source or the arrangement of photon sources can be moved, in particular scanned, relative to the recording medium.

It has been recognized that the use of a mask according to the previous prior art brought a number of disadvantages. These disadvantages together lead to the situation whereby the spatial resolution that can be achieved in practice in lithography is often much worse than the diffraction limit by about half a light wavelength.

A mask usually consists of a laterally structured light-impermeable layer, for example a chromium layer, which serves as the structure to be written and is in turn applied to a light-permeable substrate. The latter must be at least around 1-2 mm thick in order to ensure sufficient mechanical stability. The light-impermeable layer must be considerably thicker than the optical depth of penetration of the light, since the light must be completely shielded. If a small portion of the light is allowed to pass through, the recording medium will be transformed over time at sites that are not actually to be written, since the interactions with photons build up over time. The much greater thickness of the mask in comparison to the light wavelength and thus to the size of the structure then defines the minimum distance between the light source and the recording medium. The greater this distance, the greater the smearing of the written structure due to the distributions, of only finite sharpness, of the energies and irradiation directions among the photons used.

Further diffraction effects occur at the structure edges of the light-impermeable layer, which likewise leads to a smearing of the written structure.

The mask can be created only with finite precision, which leads to further uncertainty with regard to the precise dimensions of the written structure.

A mask having macroscopic dimensions, for instance the dimensions of a typical semiconductor wafer having a diameter of several inches, is usually irradiated by an expansive light source, for instance a lamp. The distribution of the intensity thereof is not homogeneous over such dimensions, so that structures in different areas of the recording medium are written with different intensities.

Since, according to the invention, a mask is now no longer needed, these sources of error will be eliminated and the achievable resolution approximates the diffraction limit. The very complicated and expensive manufacture and structuring of the mask, which according to the previous prior art formed a bottleneck in the prototypical creation of new structures, is also no longer necessary.

In order to transform a molecule or a formula unit of the recording medium from the unwritten to the written state, at least one photon is required as an energy supply. The fewer photons offered, the fewer molecules or formula units will be changed. Advantageously, therefore, the photon source is operated in working cycles in which it emits between 1 and 100 photons. If precisely one photon is emitted per working cycle, the smallest possible change is made on the recording medium.

Where precisely this change is made is probability-distributed according to the emission characteristic of the photon source. In the marginal case of large photon numbers, this probability distribution passes over into the macroscopic beam profile of the photon source. The greater the distance between the photon source and the recording medium, the more spatially expanded the probability distribution. Advantageously, therefore, the photon source is brought to a working distance of 1 μm or less from the recording medium. The minimum possible working distance is essentially defined by the surface roughness and the resulting risk of mechanical collisions between the photon source and the recording medium.

In one particularly advantageous embodiment of the invention, the photon source and the recording medium are moved relative to one another. This movement may take place along a line which is to be imparted as a structure to the recording medium. However, it may also take place, for example, in a matrix-like manner, wherein the photon source is activated only at those points of the matrix at which, according to the structure to be transferred, the recording medium is to be changed.

In this case, for each matrix point, the locations at which the emitted photons impinge on the recording medium are again probability-distributed. Nevertheless, it is possible to impart structures which are considerably smaller than the width of this distribution. To this end, advantageously a recording medium is selected, which is transformed locally from the unwritten to the written state only above a pre-defined threshold dose of photons. By suitably selecting the matrix spacing and the photon dose irradiated at each matrix point, a spatial distribution of the total photon doses irradiated onto the recording medium can be generated which is above the threshold dose only along the structure to be imparted. The fact that the other areas of the recording medium have also received photons is no longer relevant for use in practice, which distinguishes only between the states "unwritten" and "written".

In this way, with a given wavelength (energy) of the photons, structures can be transferred which are considerably smaller than the width of the probability distribution defined by the diffraction limit for the locations at which the emitted photons impinge. Conventional lithography is, in contrast, diffraction-limited and requires smaller wavelengths in order to pass to smaller structure sizes. The smaller the wavelength, the greater the outlay for the light source and optics. Thermal light sources exhibit great uncertainties with regard to the energies and directions of the Individual photons of which the light thereof is composed.

Advantageously, a photoresist for photolithography is selected as the recording medium. This can be selectively removed where it is in the written state (negative resist) or where it is in the unwritten state (positive resist). The substrate to which the photoresist had been applied can then be physically or chemically processed, for example by ion etching or wet chemical etching, through the photoresist mask thus structured. In this way, the structure is transferred from the recording medium into the substrate. Besides a photoresist, phase change media and heat-activated media are also suitable for example as the recording medium.

In one particularly advantageous embodiment of the invention, an arrangement of a plurality of photon sources which can be actuated separately is selected. These may in particular be arranged in a matrix having a matrix spacing of 100 nm or less, preferably 50 nm or less. Individual photon sources are available with dimensions as small as 20 nm. The matrix may be one-dimensional, for instance a dot matrix along a line, or two-dimensional, for example a grid-like dot matrix. Each individually activated photon source then occupies the recording medium with a spatial probability distribution of the photons emitted by it, wherein the distributions originating from adjacent activated photon sources may also overlap. The recording medium is transformed from the unwritten to the written state wherever, in sum, at least the required threshold value of photons impinges. Structures having dimensions which move in the order of magnitude of the dot matrix can be clearly reproduced directly by way of a rule as to which photon sources in the matrix are to be activated for how long and how often. With a physically created arrangement, a large number of different structures can be written by changing the actuation. An adaptation of the structure does not then require any adaptation of a hardware-based mask, but rather can be brought about by a software-based change to the actuation.

In one particularly advantageous embodiment of the Invention, the frequency and/or duration $x_i$ with which and/or for which each photon source i is operated is determined as the solution to an equation system in which the photon dose $D_k$ irradiated onto or into the recording medium at each location k is expressed as the sum of the contributions $d_{ik}(x_i)$ which each photon source i makes to this photon dose $D_k$. Here, the $D_k$ on the right-hand side are predefined by the structure to be imparted, the continuous recording medium being discretized into individual locations k. The contributions $d_{ik}(x_i)$ depend on the emission characteristic of the photon sources. In principle, the structure that is actually written always deviates slightly from the predefined structure since the probability distributions regarding the locations at which the photons emitted by each photon source impinge onto or into the recording medium do not necessarily have a form similar to the structure to be written. However, since these probability distributions overlap, the contributions of the individual photon sources can be optimized by solving the equation system so that the deviations are minimized.

Advantageously, the contributions $d_{ik}(x_i)$ are expressed as the product of $x_i$ with the probability $p_{ik}$ that an individual photon emitted by the photon source i impinges onto or into the recording medium at the location k. The equation system is then linear. Its coefficients include the emission characteristic of the individual photon sources, the spatial arrangement thereof and the fineness with which the recording medium has been discretized into individual locations k.

In one particularly advantageous embodiment of the invention, the arrangement of photon sources is brought into n different positions relative to the recording medium. In the equations of the equation system, $D_k$ is expressed as the sum of the contributions $d_{ikp}(x_p)$ which each photon source i makes to the photon dose $D_k$ at the position p=1, . . . , n. The n positions may be, for example, the dots of a dot matrix which is considerably finer than the matrix of the locations k at which the photon doses $D_k$ to be achieved are defined. The solution to this equation system is a set $x_{ip}$, that is to say, for each photon source i, a precise rule regarding the location p at which said photon source is to be activated for how long and how often. From a predefined structure that is to be imparted to the recording medium, a "light show" of the individual photon sources is obtained, which is played out while the arrangement of photon sources successively arrives at one location p=1, . . . , n after the other.

In this way, it is even possible to impart structures which are considerably smaller than the matrix in which the photon sources are arranged. The precision with which the arrangement of photon sources can be displaced relative to the recording medium is in part converted into the precision of the imparted structure.

The subject matter of the invention will be explained below with reference to figures, without the subject matter of the invention being limited hereby. The figures show.

BRIEF DESCRIPTION OF THE DRAWINGS

In the embodiments disclosed hereinbelow, the individual photon sources have a photon flux of less than $10^4$ photons per second.

DETAILED DESCRIPTION OF THE PREFERRED EMBODIMENTS

Figure 1:
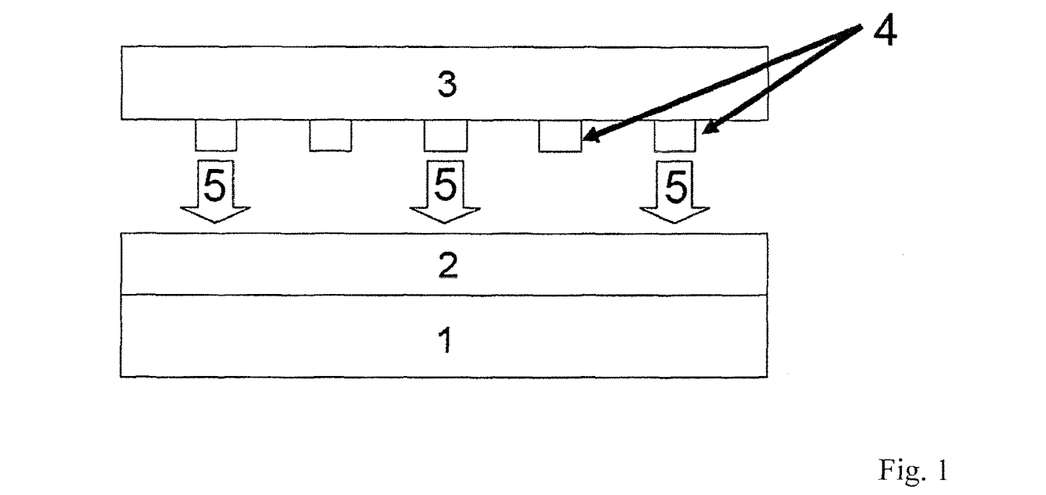
FIG. 1 shows an exemplary embodiment of the method according to the invention.

FIG. 1 schematically shows an exemplary embodiment of the method according to the invention. The recording medium 2, to which a structure is to be imparted, is applied to a substrate 1. In order to impart the structure, a carrier substrate 3 having a plurality of individual photon sources 4 is brought into the vicinity of the recording medium 2. The recording medium 2 is then transformed from the unwritten to the written state only in the region of those sources 4 which are activated and emit light 5. Different structures can thus be written solely by way of a different actuation. In a simplified form of this exemplary embodiment, the individual photon sources 4 cannot be actuated separately but rather are either all activated or all not activated. The written structure is then defined by the two-dimensional arrangement of the sources 4 in the plane of the carrier substrate 3.

Figure 2:
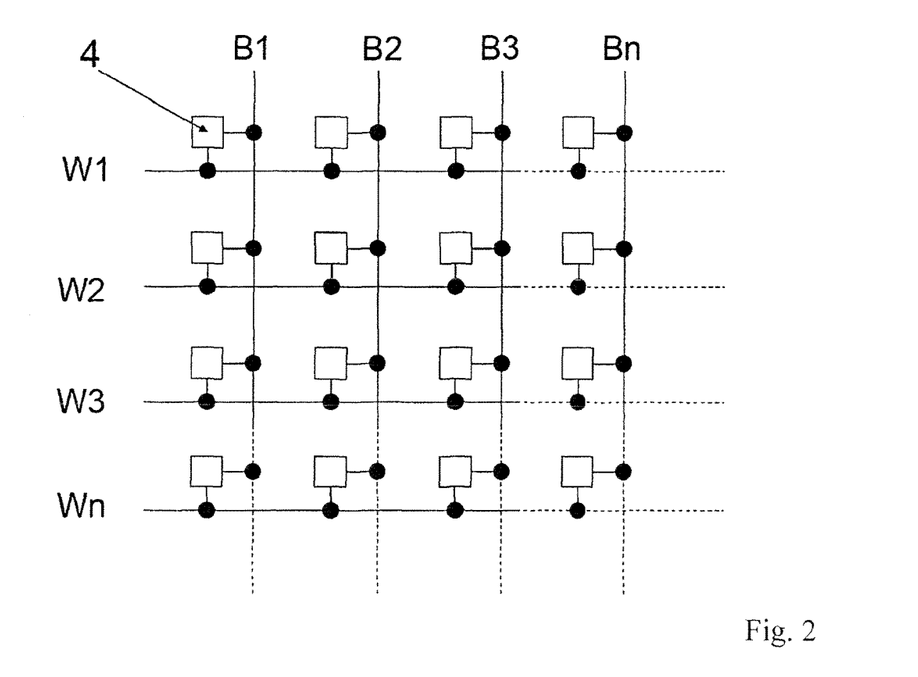
FIG. 2 shows a switching diagram for the separate actuation of individual photon sources in a matrix.

FIG. 2 shows a switching diagram for the separate actuation of sources 4. A linear matrix of word lines W1, W2, . . . , Wn and a second linear matrix of bit lines B1, B2, . . . , Bn are provided. The two linear matrices together create a square grid. The sources 4 are arranged in the same periodicity as this square grid, wherein one source is connected to precisely one word line and precisely one bit line. When a voltage is applied between one word line and one bit line, precisely one source 4 is thus activated. The word lines and bit lines must not run in the same plane and must also not run in one plane with the sources 4. If the sources 4 are light-emitting diodes (LEDs), for example, in which the stack of n-contact, pn-transition and p-contact runs in the direction of the normal on the plane of the drawing, then for example the word lines may run below the n-contacts or in the plane of the n-contacts, so that each word line connects only n-contacts to one another. The bit lines may run above the p-contacts or in the plane of the p-contacts, so that each bit line connects only p-contacts to one another.

In such a cross-bar array, between one word line and one bit line there is in principle just one current path through the source 4, which is switched directly between this word line and this bit line. Besides this direct path, there are also further parasitic paths through a plurality of further sources 4. However, each source on such a parasitic path is acted upon by a much lower voltage than the source that is switched directly between the actuated word line and the actuated bit line. The voltage on the sources on parasitic paths is lower than the bandgap-dependent minimum voltage that is required in order to cause an LED to illuminate. Therefore, only the source 4 that is switched directly between the actuated word line and the actuated bit line is caused to illuminate, even though there are parasitic paths through further sources.

Figure 3A:
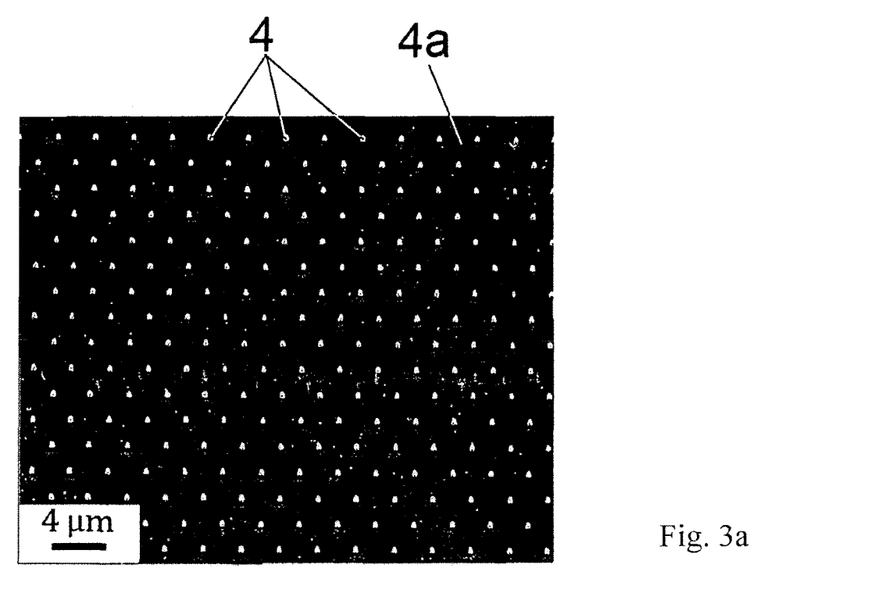
FIGS. 3*a* and 3*b* show images, taken by electron microscopy, of a hexagonal arrangement of photon sources.
Figure 3B:
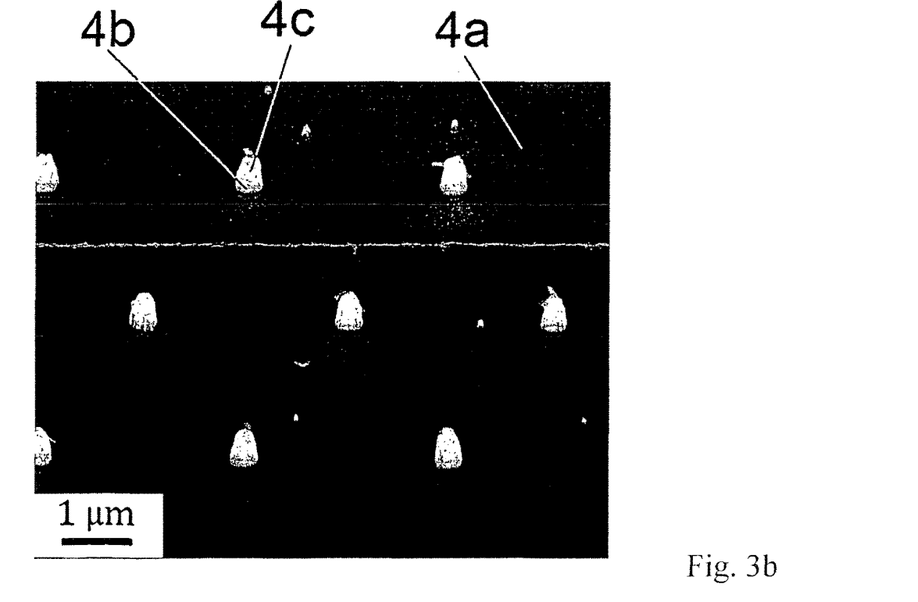

FIG. 3 shows images, taken by electron microscopy, of a hexagonal arrangement of sources 4. Sub-image b is a zoomed image of a portion of sub-image a. The sources 4 are LED structures, the common n-region of which is the n-doped GaN layer 4a on a sapphire substrate, this layer being shown in dark in FIG. 3. Located on the n-doped GaN layer 4a are etched columns of an undoped GaInN/GaN multilayer structure 4b, which each form a multi-quantum well (MQW). The MQW acts as an active medium which determines the wavelength of the photon source. On each MQW, p-doped GaN is grown as the p-region 4c.

The arrangement was produced by first applying the multilayer structure 4b and the p-region 4c as flat layers to the GaN layer 4a. Photoresist was then structured by electron beam lithography so that the p-region 4c was exposed wherever a source 4 was to remain as a column. A nickel layer was applied and then the photoresist was removed by lifting off so that nickel 4d remained only on the p-regions 4c and was otherwise removed. The multilayer structure 4b and the p-region 4c were etched down to the GaN layer 4a wherever they were not protected by nickel.

At the stage shown in FIG. 3, the arrangement still lacks the electrical contacting of the p-regions 4c to the outside world. This can be achieved by introducing an isolating material between the columns to such a height that only the regions 4c and 4d still protrude. One such suitable isolating material, for example, is hydrogen silsesquioxane (HSQ), which can be applied to the arrangement by spin coating and forms insulating $SiO_2$ as the end product under the effect of heat. When the $SiO_2$ layer is formed, the nickel is selectively removed and a transparent, electrically conductive contact layer composed of a nickel-gold alloy is applied, which connects the desired regions 4c to the outside world. N-contacts are produced by Ar ion beam etching of the $SiO_2$ down to the n-GaN layer in the regions which were defined beforehand by lithographic processes. A metallization with Ti/Al/Ni/Au layers then takes place, these subsequently being alloyed.

The arrangement can also be configured in such a way that the sources 4 can be addressed individually. To this end, the GaN layer 4a is structured in the form of word lines which each connect one row of columns to one another. Each column then stands in each case on precisely one word line, and between the word lines the GaN layer 4a is removed down to the sapphire substrate so that the word lines are isolated from one another. The transparent, electrically conductive contact layer is structured laterally in the form of bit lines, which in each case connect columns of regions 4c to one another and to the outside world. By applying a voltage between one word line and one bit line, precisely one source 4 can then be activated.

Figure 4A:
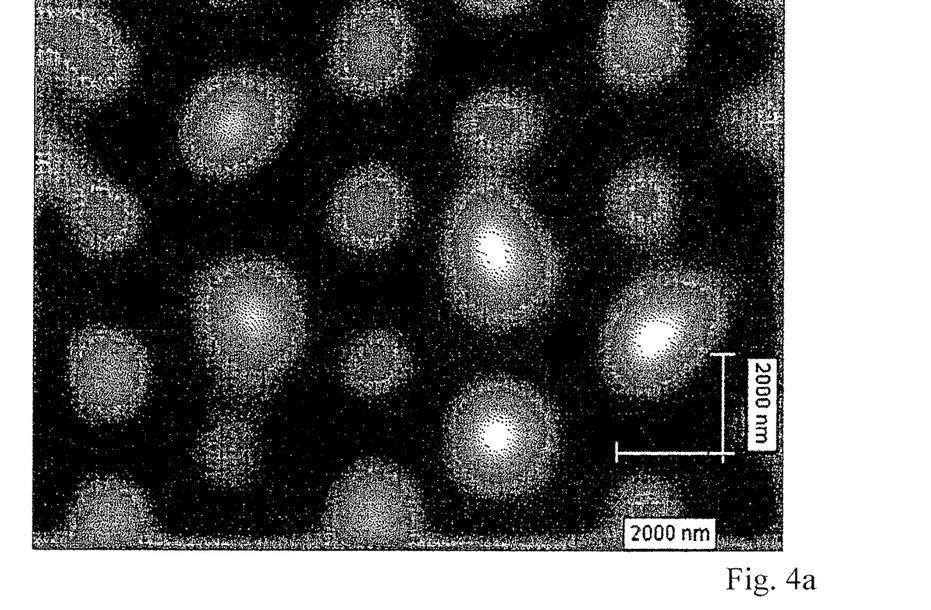
FIGS. 4*a* and 4*b* show characterization of the light emission from the photon sources shown in FIG. 3.

FIG. 4a shows the spatial distribution of the photoluminescence which the layer system shown in FIG. 3 has emitted upon optical excitation with a light wavelength of 325 nm. The photoluminescence took place at a wavelength of 440 nm. The measurement of the photoluminescence is suitable as an intermediate test for quality control purposes during manufacture. If no photoluminescence shows, the arrangement produced is waste and the further process steps are superfluous.

Figure 4B:
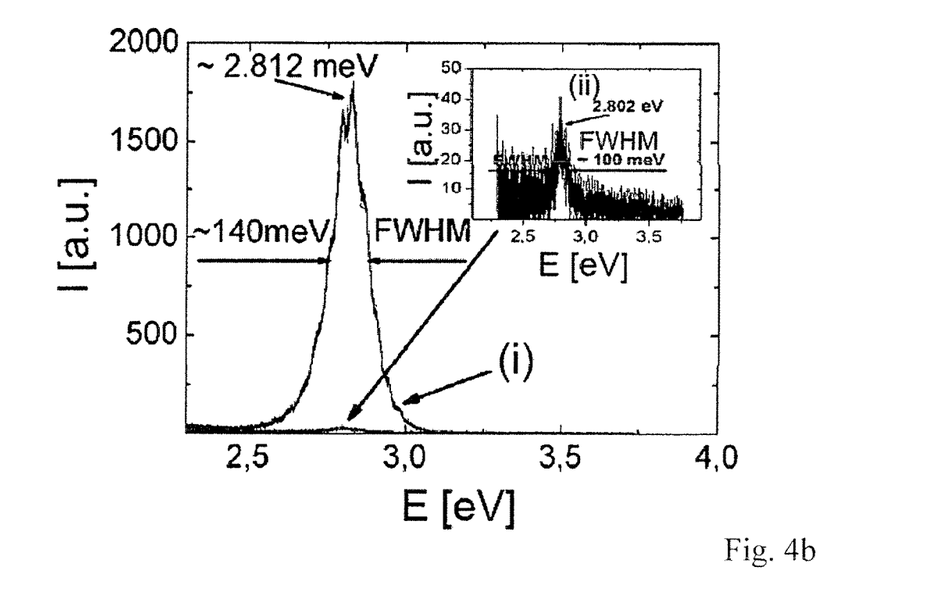

FIG. 4b shows the intensity distribution I of the electroluminescence over the energy E for the flat layer stack from which the arrangement shown in FIG. 3 was produced (prior to application of the photoresist (curve (i)), and for an individual source 4 (curve (ii)). The distribution has a full width at half maximum (FWHM) of 140 meV for curve (i) and a full width at half maximum of 100 meV for curve (ii). By reducing the spatial dimension of the source 4 from the flat layer to the column, the number of emitted photons per unit time is reduced so far that, given a sufficiently short pulse duration, the emission of individual photons can be brought about. The smaller the etched column, the higher the quantum confinement in the columns and the narrower the range of photon energies emitted by an individual photon source.

FIG. 5 shows a further exemplary embodiment of an individual photon source 4 which is suitable for carrying out the method according to the invention. First, an n-doped GaN layer 52 is applied to a sapphire substrate 51 by a MOVPE process. An HSQ layer 53 is applied thereto by spin coating, said layer forming insulating SI)$_2$ as the end product under the effect of heat. A polymer polymethyl methacrylate PMMA is applied and serves as a positive resist for the electron beam lithography. Wherever the individual photon source 4 is to be located, the layer is exposed to an electron beam and then is selectively removed. The exposed SiO$_2$ is removed by means of reactive ion etching. The PMMA is then removed. SiO$_2$ is not only an insulating material but serves as a mask for the subsequent epitaxy. By a further MOVPE process, InN is selectively applied to the n-GaN through the opening created in the HSQ layer. The InN grows as a pyramid 54 out of the SiO$_2$ mask. The pyramid is overgrown conformally by p-doped GaN 55. The p i n transition of the LED is formed between the p-doped GaN, the undoped InN and the n-doped GaN (FIG. 5a).

Figure 5A:
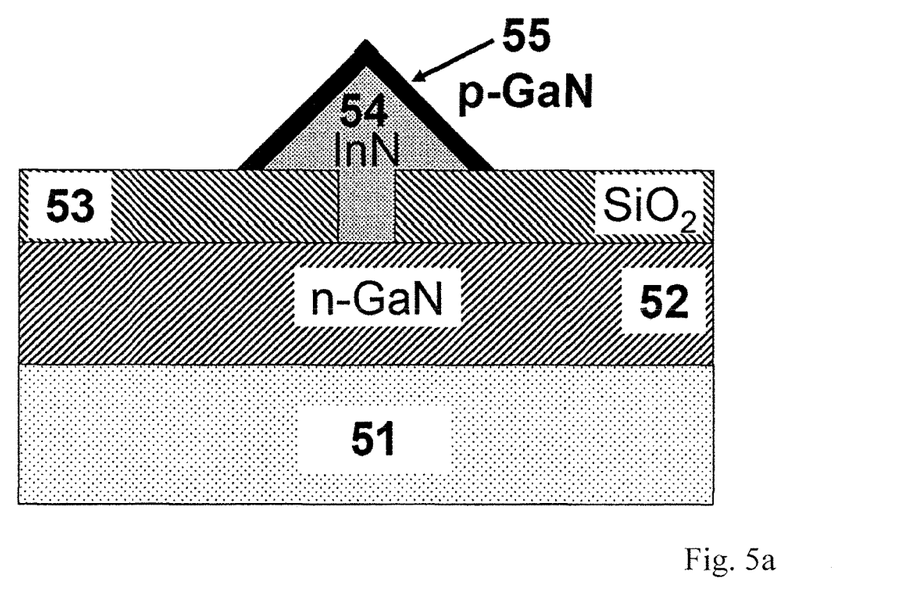
FIGS. 5*a*, 5*b*, 5*c*, and 5*d* show pyramid-shaped individual photon source.
Figure 5B:
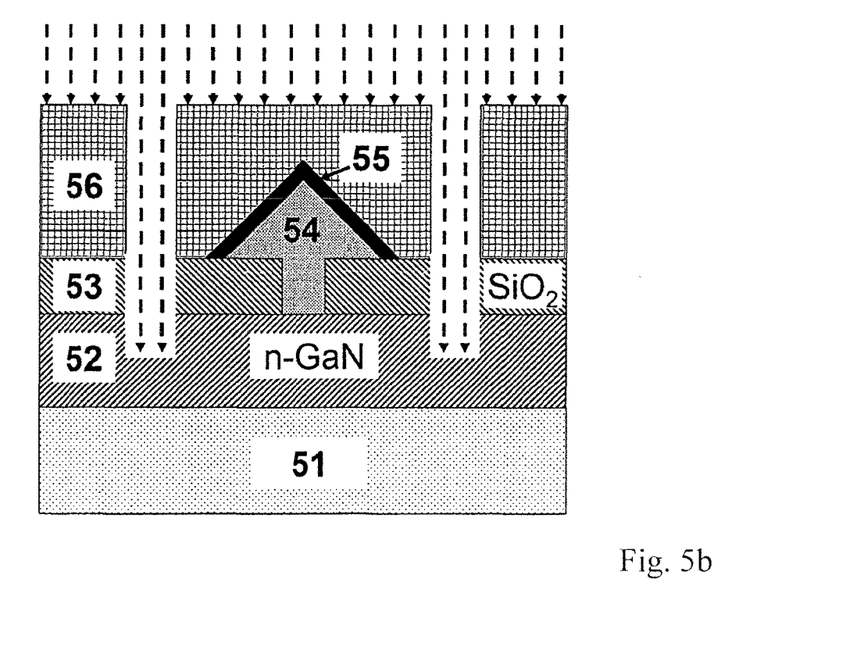
Figure 5C:
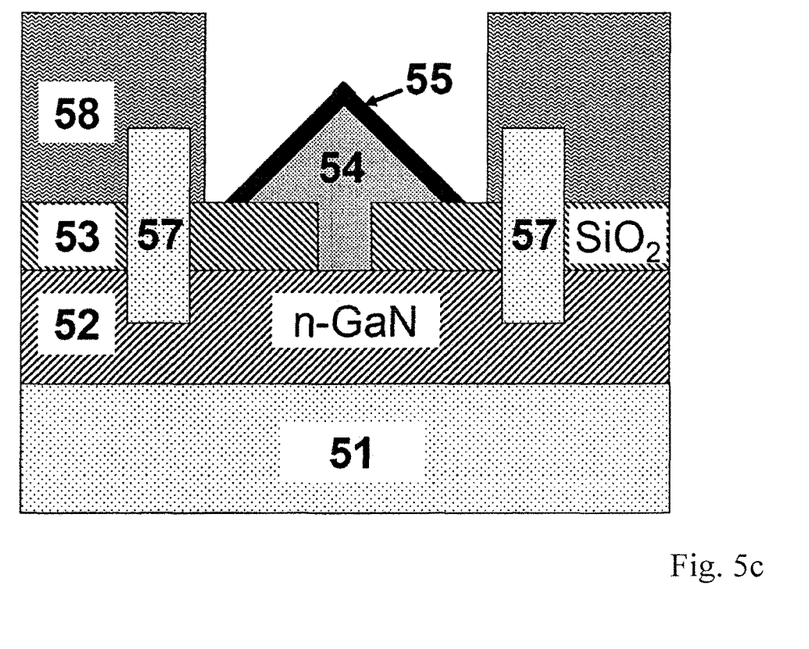

A photoresist layer 56 is applied and is structured by lithography such that regions in which the SiO$_2$ layer 53 is exposed are created to the left and to the right of the pyramid 54/55. In these regions, the SiO$_2$ layer 53 and a region of the n-GaN layer 52 that is close to the surface are etched away by the argon ion etching illustrated by dashed arrows (FIG. 5b). The metals Ti/Al/Ni/Au are then applied, which in these regions, after alloying, form metal contacts 57 which connect the n-GaN layer to the outside world. The remaining metal is removed by lifting off the photoresist layer 56. A further photoresist layer 58 is applied and is structured laterally in such a way that the pyramid 54 is exposed (FIG. 5c).

Figure 5D:
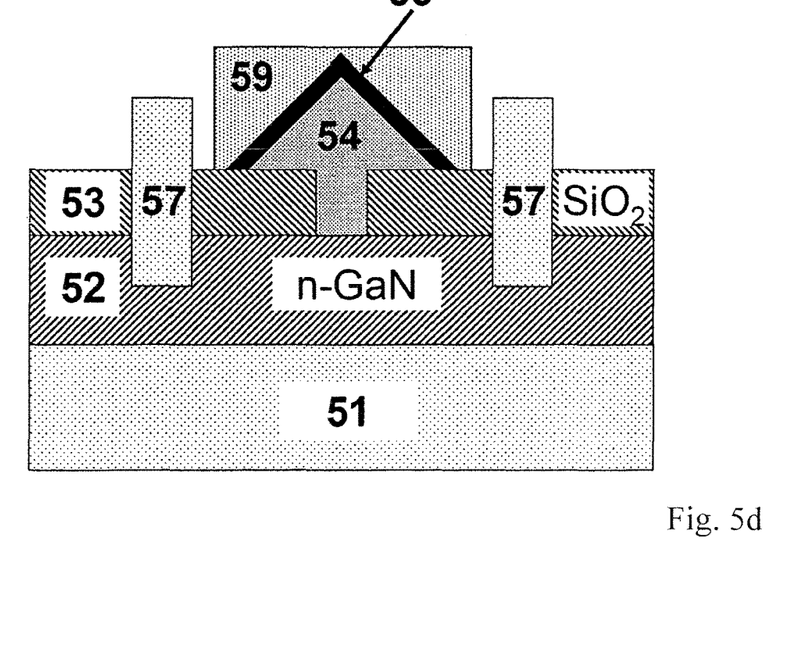

Metal is again applied, in this case Ni and Au, which surrounds the pyramid 54/55. The metal deposited on the photoresist layer 58 is removed by lifting off again. A metal contact 59 remains, via which the pyramid 54/55 can be actuated. The photon source is activated when a voltage is applied between the contacts 57 and 59.

Figure 6:
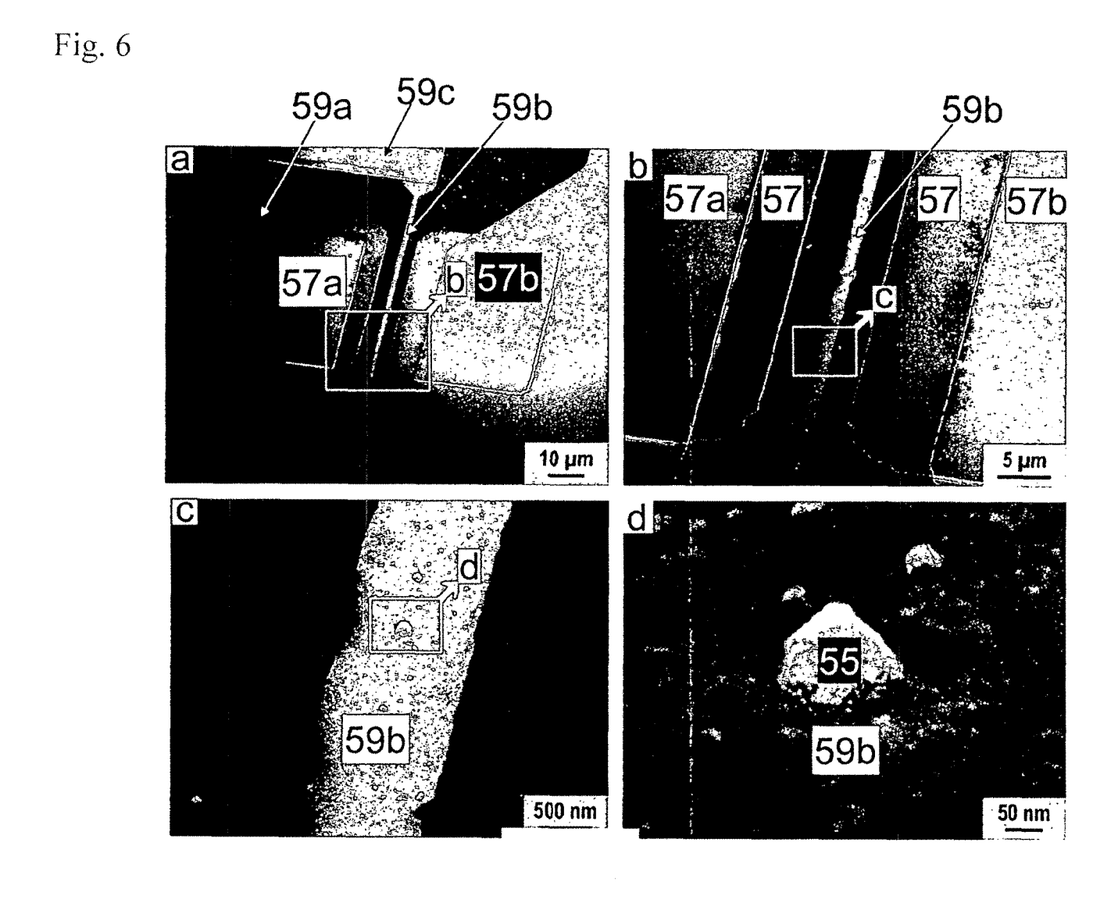
FIG. 6 shows integration of the individual photon source shown in FIG. 5 into a high-frequency structure.

FIG. 6 shows images, taken by way of electron microscopy, of an individual photon source produced in this way, which is integrated in a high-frequency structure. Sub-images a-d show different zoom stages. The contact 59 is configured here as a metal tongue 59a, 59b which covers the (still visible) p-GaN-coated InN pyramid 54/55. In each case two of these tongues open into a macroscopic contact pad 59c for electrically connecting the pyramid 54/55 to the outside world. The contacts 57 likewise open into macroscopic contact pads 57a, 57b for connecting the n-GaN layer to the outside world. When a voltage is applied between the contact pads 59c and 57a, the source on the metal tongue 59a is activated.

The invention claimed is:

1. A photolithography method for writing on a recording medium by optically imparting a structure to the recording medium, comprising irradiating only selected areas of the recording medium with photons from a plurality of photon sources configured to be actuated separately, the medium comprising a material having a physical or chemical property which changes upon irradiation with photons, the changes in the property constituting the structure imparted to the recording medium, and conducting the irradiation at a photon flux of less than $10^4$ photons per second, and wherein, for each photon source, at least one of frequency at which the photon source is operated and the photon source operation duration, $x_i$, is determined as the solution to an equation system in which the photon dose $D_k$ with which the recording medium is irradiated at each location k is expressed as the sum of the contributions $d_{ik}(x_i)$ which each photon source i makes to the photon dose $D_k$.

2. The method according to claim 1, wherein the photon source is operated in working cycles in which it emits between 1 and 100 photons.

3. The method according to claim 1, wherein the photon source is set at a working distance of 1 m or less from the recording medium.

4. The method according to claim 1, wherein the photon source and the recording medium are moved relative to one another.

5. The method according to claim 1, wherein the recording medium is one in which the irradiated areas are transformed from an unwritten to the written state only above a predefined threshold dose of photons.

6. The method according to claim 1, wherein the recording medium is a photoresist for photolithography.

7. The method according to claim 1, wherein the photon sources are arranged in a matrix having a matrix spacing of 100 nm or less, preferably 50 nm or less.

8. The method according to claim 1, wherein in the equation system, the contributions $d_{ik}(x_i)$ are expressed as the product of $x_i$ with the probability $p_{ik}$ that an individual photon emitted by the photon source i impinges onto or into the recording medium at the location k.

9. The method according claim 1, wherein the arrangement of photon sources is brought into n different positions relative to the recording medium, and $D_k$ is expressed as the sum of the contributions $d_{ik}(x_i)$ which each photon source i makes to the photon dose $D_k$ at the position p=1, . . . , n.

10. The method according to claim 7, wherein the matrix spacing is 50 nm or less.

11. The method according to claim 1, wherein the selected areas are irradiated without use of a mask.

* * * * *